US006677225B1

(12) United States Patent
Ellis et al.

(10) Patent No.: US 6,677,225 B1
(45) Date of Patent: Jan. 13, 2004

(54) SYSTEM AND METHOD FOR CONSTRAINING TOTALLY RELEASED MICROCOMPONENTS

(75) Inventors: Matthew D. Ellis, Allen, TX (US); Eric G. Parker, Wylie, TX (US); George D. Skidmore, Plano, TX (US)

(73) Assignee: Zyvex Corporation, Richardson, TX (US)

( * ) Notice: Subject to any disclaimer, the term of this patent is extended or adjusted under 35 U.S.C. 154(b) by 297 days.

(21) Appl. No.: 09/616,500

(22) Filed: Jul. 14, 2000

(51) Int. Cl.[7] .............................................. H01L 21/44
(52) U.S. Cl. ..................... 438/598; 438/598; 438/50; 438/739; 438/619; 257/499; 156/345
(58) Field of Search ................................ 438/598, 619, 438/48–50, 254, 456, 733–739; 257/499, 414–417; 156/345; 385/14, 52

(56) References Cited

U.S. PATENT DOCUMENTS

| 4,740,410 A | | 4/1988 | Muller et al. ................ 428/133 |
| 5,111,693 A | | 5/1992 | Greiff |
| 5,393,375 A | * | 2/1995 | MacDonald et al. ......... 156/643 |
| 5,401,983 A | * | 3/1995 | Jokerst et al. ................ 257/82 |

(List continued on next page.)

FOREIGN PATENT DOCUMENTS

| EP | 0-834-759 A2 | * | 9/1997 | ........... G02B/26/08 |
| EP | 0834759 A2 | | 8/1998 | |
| WO | WO 02/06152 A2 | * | 7/2001 | ............. B81B/7/00 |

OTHER PUBLICATIONS

McNile et al. "Advanced miromechanical prototyping in polysilicon and soi" Demonstrated micromachining technology for industry—Seminar, 2000 pp. 8/1–8/4.*

Krygowski et al. "A low–voltage rotary actuator fabricated using a five–level polysilicon surface micromachining technology" IEDM 99 (0–7803–5410–9/99 IEEE. pp. 697–700.*

Mehregany, Mehran et al., Principles in design and microfabrication of variable–capacitance side–drive motors, American Vacuum Society, 1990, pp. 3614–3624.

*Primary Examiner*—Matthew Smith
*Assistant Examiner*—Granvill D Lee, Jr.
(74) *Attorney, Agent, or Firm*—Haynes and Boone, LLP

(57) ABSTRACT

A system and method are disclosed which constrain a microcomponent that is totally released from a substrate for handling of such totally released microcomponent. A preferred embodiment provides a system and method which constrain a totally released microcomponent to a base (e.g., another microcomponent or a substrate). For example, a preferred embodiment provides constraining members that work to constrain a microcomponent to a substrate as such microcomponent is totally released from such substrate. Accordingly, such constraining members may aid in preserving the microcomponent with its substrate during the release of such microcomponent from its substrate during fabrication. Additionally, a preferred embodiment provides constraining members that are suitable for constraining a totally released microcomponent to a base for post-fabrication handling of the microcomponent. To further aid in post-fabrication handling of totally released microcomponents, a preferred embodiment may be implemented as a "pallet" having one or more microcomponents constrained thereto. Moreover, constraining members of a preferred embodiment enable the totally released microcomponent to be removed from such constraints when desired, but prevents the totally released microcomponent from inadvertently escaping such constraints. For instance, in one embodiment, the constraining members are implemented as moveable members that can be moved to unconstrain the totally released microcomponent from its base.

67 Claims, 8 Drawing Sheets

U.S. PATENT DOCUMENTS

| | | | |
|---|---|---|---|
| 5,492,596 A * | 2/1996 | Cho | 156/632.1 |
| 5,574,279 A * | 11/1996 | Ikeda et al. | 250/306 |
| 5,645,684 A | 7/1997 | Keller | 156/643.1 |
| 5,660,680 A | 8/1997 | Keller | 438/50 |
| 5,847,454 A * | 12/1998 | Shaw et al. | 257/734 |
| 5,882,532 A | 3/1999 | Field et al. | |
| 5,914,521 A | 6/1999 | Gutteridge et al. | |
| 5,949,571 A * | 9/1999 | Goossen et al. | 359/291 |
| 5,955,659 A * | 9/1999 | Gupta et al. | 73/54.01 |
| 5,995,688 A * | 11/1999 | Aksyuk et al. | 385/14 |
| 6,073,484 A * | 6/2000 | Miller et al. | 73/105 |
| 6,087,747 A * | 7/2000 | Dhuler et al. | 310/90 |
| 6,103,399 A * | 8/2000 | Smela et al. | 428/623 |
| 6,173,105 B1 * | 1/2001 | Aksyuk et al. | 385/140 |
| 6,246,504 B1 * | 6/2001 | Hagelin et al. | 359/212 |
| 6,262,464 B1 * | 7/2001 | Chan et al. | 257/414 |
| 6,347,002 B1 * | 2/2002 | Hagelin et al. | 359/201 |
| 6,379,989 B1 * | 4/2002 | Kubby et al. | 438/52 |

* cited by examiner

SYSTEM AND METHOD FOR CONSTRAINING TOTALLY RELEASED MICROCOMPONENTS

RELATED APPLICATIONS

This application is related to co-pending and commonly assigned U.S. patent application Serial Numbers 09/569,330 entitled "METHOD AND SYSTEM FOR SELF-REPLICATING MANUFACTURING STATIONS," 09/570,170 entitled "SYSTEM AND METHOD FOR COUPLING MICROCOMPONENTS," and 09/569,329 entitled "GRIPPER AND COMPLEMENTARY HANDLE FOR USE WITH MICROCOMPONENTS," the disclosures of which are hereby incorporated herein by reference.

TECHNICAL FIELD

The present invention relates in general to a system and method for constraining microcomponents in a desirable manner, and in specific to a method and system for handling microcomponents that are totally released from a substrate in a manner that enables such microcomponents to be constrained to a base and unconstrained as desired.

BACKGROUND

Extraordinary advances are being made in micromechanical devices and microelectronic devices. Further, advances are being made in MicroElectroMechanical System ("MEMS") devices, which comprise integrated micromechanical and microelectronic devices. The terms "microcomponent" and "microdevice" will be used herein generically to encompass microelectronic components, micromechanical components, as well as MEMS components. Traditionally, microcomponents are fabricated on a substrate in a manner such that the microcomponents are fixed or anchored to such substrate. Thus, microcomponents are traditionally not totally released from a substrate, but instead are fixed to the substrate.

An example of a typical fabrication process of the prior art is described in conjunction with FIGS. 1A–1E. Turning to FIG. 1A, a substrate (e.g., a wafer) 102 is provided, on which a first layer of sacrificial release layer (e.g., silicon oxide) 106 is deposited. As shown in FIG. 1B, the sacrificial release layer 106 is then etched (or patterned) into a desired shape. Typically, the sacrificial release layer 106 is etched to form an opening therein to the substrate 102, as shown in FIG. 1B. Thereafter, a layer of polysilicon ("P1") 108 is deposited, as shown in FIG. 1C. Where the sacrificial release layer 106 was etched to form an opening to substrate 102, P1 108 fills such opening to form an anchor 104, which anchors the structure to substrate 102. As shown in FIG. 1D, the P1 layer 108 is then etched (or patterned) into a desired shape. Further polysilicon and sacrificial release layers may be added in a similar manner. Additionally, electrical conducting layers (e.g., gold) and electrical insulating layers (e.g., silicon nitride) may be added to produce a microcomponent having electrical conductivity and/or insulation. Finally, the sacrificial release layers, 106 for example, may be released by exposing such sacrificial release layers to a releasing agent, such as hydrofluoric acid (HF), resulting in a microcomponent that is fixed (or "anchored") to the wafer, as shown in FIG. 1E.

In most respects it has been beneficial for a microcomponent to be fixed (or anchored) to its substrate, in the prior art. For example, if the microcomponent is not anchored to the substrate during the release of the sacrificial layers (e.g., layer 106), the microcomponent may become lost, mis-positioned, or otherwise difficult to handle. For instance, to release the sacrificial layers, a substrate is commonly placed in an HF bath. Thus, if the microcomponent were not anchored to the substrate, the microcomponent might float around in the HF bath. Furthermore, the microcomponent may become mis-positioned (e.g., positioned in an undesirable manner on the substrate) and/or be difficult to handle in the HF bath. However, many situations arise in which it is desirable to totally release a microcomponent from its substrate. For example, it may be desirable to release a microcomponent from its substrate in order to perform assembly operations with such released microcomponent, e.g., assemble the released microcomponent to other microcomponents. Accordingly, relatively crude techniques have been developed in the prior art for removing a microcomponent from its substrate anchoring.

An example of a first prior art technique is described in conjunction with FIG. 2. As shown, microcomponent 208 may be anchored to wafer 202 with anchor 204. As described in the exemplary fabrication process above, the anchor 204 may be a polysilicon layer and the microcomponent 208 may comprise any number of additional layers. It can be seen that the microcomponent 208 may be removed from the wafer 202 by breaking anchor 204. However, such a crude form of removing microcomponents is often undesirable for several reasons. First, such breaking of the anchor 204 presents difficulty in defining the shape of microcomponent 208. For example, a portion of a broken anchor 204 may remain attached to microcomponent 208. Additionally, such an attached portion of a broken anchor 204 may be in the form of a spur or spike, as examples, which may be an undesirable feature to be included within microcomponent 208. Additionally, breaking of the anchor 204 may result in particles of silicon, the presence of which may be undesirable. For example, such particles may land on and interfere with the operation of microcomponent 208 or other microcomponents. Also, such particles may present a health hazard to persons that inhale such particles.

An example of a second prior art technique for removing microcomponents from a substrate is described in conjunction with FIG. 3. As shown in FIG. 3, microcomponent 308 is fixed to a tether 304 which is anchored to wafer 302 with anchor 306. As described in the exemplary fabrication process of FIGS. 1A–1E above, the anchor 306 may be a polysilicon layer and the microcomponent 308 may comprise any number of additional layers. Further, tether 304 may be in any layer that is fixed to the microcomponent 308, for example. It can be seen that the microcomponent 308 may be removed from the wafer 302 by breaking tether 304. An example of this technique is disclosed by Chris Keller in *Microfabricated High Aspect Ratio Silicon Flexures*, 1998. More specifically, Keller discloses a photoresist tether holding a polysilicon beam (microcomponent) to a polysilicon anchor, wherein the tether may then be broken to release the polysilicon beam component (see e.g., FIGS. 4.59 and 4.60 and discussion thereof). However, as discussed above, such a crude form of removing microcomponents is often undesirable and presents the same problems described above for breaking anchor 204 of FIG. 2. More specifically, such breaking of the tether 304 presents difficulty in defining the shape of microcomponent 308. For example, a portion of a broken tether 304 may remain attached to microcomponent 308. Additionally, such an attached portion of a broken tether 304 may be in the form of a spur or spike, as examples, which may be an undesirable feature to be included within microcomponent 308. Additionally, breaking of the tether 304 may result in particles, which may be undesirable. For example, such particles may land on and interfere with the operation of microcomponent 308 or other microcomponents, and such particles may present a health hazard to persons that inhale them.

Recent developments have allowed for fabrication of "totally released" microcomponents (e.g., stand-alone microcomponents that are totally released from the substrate). For example, the process as disclosed in U.S. Pat. No. 4,740,410 issued to Muller et al. entitled "MICROMECHANICAL ELEMENTS AND METHODS FOR THEIR FABRICATION," U.S. Pat. No. 5,660,680 issued to Chris Keller entitled "METHOD FOR FABRICATION OF HIGH VERTICAL ASPECT RATIO THIN FILM STRUCTURES," and U.S. Pat. No. 5,645,684 issued to Chris Keller entitled "MULTILAYER HIGH VERTICAL ASPECT RATIO THIN FILM STRUCTURES" may be utilized to fabricate totally released microcomponents. As a further example, the fabrication process disclosed in concurrently filed and commonly assigned U.S. patent application Ser. No. 09/569,330 entitled "METHOD AND SYSTEM FOR SELF-REPLICATING MANUFACTURING STATIONS" allows for fabrication of totally released microcomponents. Furthermore, such fabrication process also allows for the fabrication of electrically isolated microcomponents. Additionally, other fabrication processes may be developed in the future, which may also allow for totally released microcomponents.

However, difficulties with constraining (e.g., restricting or restraining) totally released microcomponents need to be overcome. For example, when a microcomponent is totally released from its substrate during exposure to a releasing agent, such microcomponent may become lost, mis-positioned, or otherwise difficult to handle. For instance, if the microcomponent were totally released from the substrate during a HF bath, the microcomponent might float around in such HF bath. Thus, a desire exists for a system, method, and apparatus for constraining (e.g., restricting or restraining) a totally released microcomponent (e.g., to some type of base). Still a further desire exists for a system, method, and apparatus for handling totally released microcomponents. For instance, a desire exists for a system, method, and apparatus that allows for handling of totally released microcomponents in a manner that reduces the potential for such microcomponents becoming lost, mis-positioned, damaged, and/or otherwise mishandled. Given that it may often be desirable to handle totally released microcomponents in some manner, e.g., for transporting such totally released microcomponents, a desire exists for a system, method, and apparatus that aids in the handling of totally released microcomponents.

SUMMARY OF THE INVENTION

These and other objects, features and technical advantages are achieved by a system and method which constrain a microcomponent that is totally released from a substrate for handling of such totally released microcomponent. A preferred embodiment provides a system and method which constrain a totally released microcomponent to a "base". As used herein, a "base" to which a totally released microcomponent may be constrained is intended to encompass a substrate, another microcomponent, a pallet, and any other surface to which it may be desirable to constrain a microcomponent. Thus, for example, in one implementation of a preferred embodiment, totally released microcomponent may be constrained to a substrate. As a further example, a preferred embodiment may be implemented to constrain a totally released microcomponent to another microcomponent. As still a further example, a most preferred embodiment provides constraining members that work to constrain a microcomponent to a substrate as such microcomponent is totally released from such substrate. Accordingly, such constraining members may aid in the removal of a microcomponent from a substrate in a manner that does not require breaking of a physical coupling between the microcomponent and the substrate (e.g., does not require breaking of a polysilicon tether or anchor to remove the microcomponent). Rather, such microcomponent may be released through exposure to a chemical releasing agent (e.g., HF), wherein the constraining members may work to preserve the location of the totally released microcomponent relative to its substrate.

As a further example, a preferred embodiment provides constraining members that are suitable for constraining a totally released microcomponent for post-fabrication handling of the microcomponent. For instance, such constraining members may preserve the totally released microcomponent with a base (e.g., its substrate) during shipment of the totally released microcomponent to a customer. Most preferably, the constraining members are implemented in a manner to aid in maintaining a desired position/orientation of the totally released microcomponent, which may enable positional assembly operations with such microcomponent.

To further aid in post-fabrication handling of totally released microcomponents, a preferred embodiment of the present invention may be implemented as a "pallet" having one or more microcomponents constrained thereto. For instance a pallet may be implemented which includes multiple totally released microcomponents constrained thereto. Furthermore, such a pallet may be nested, wherein a first microcomponent (or base) may be constrained to a second microcomponent (or base), which may in turn be constrained to a base (e.g., a substrate). Various microcomponents may be arranged on the pallet in a desired manner that enable positional assembly to be performed with such microcomponents, for example.

The constraining members of a most preferred embodiment may include vertical constraining members arranged to restrict vertical movement of a totally released microcomponent relative to a base. For instance, vertical constraining members may include a flap or flaps that overhang and/or underhang at least a portion of the totally released microcomponent. Furthermore, the constraining members of a most preferred embodiment may also include horizontal constraining members arranged to restrict lateral movement of a totally released microcomponent relative to a base. Moreover, in a most preferred embodiment, the constraining members may be implemented in a manner that enables the totally released microcomponent to be removed from such constraints when desired, but prevents the totally released microcomponent from inadvertently escaping such constraints. For instance, in one embodiment, the constraining members are implemented as moveable members that can be moved to unconstrain the totally released microcomponent from its base.

Thus, a preferred embodiment enables a totally released microcomponent to be constrained to a base in a manner that prevents inadvertent escape of such microcomponent from such base, but allows for one to intentionally remove the microcomponent from such constraints.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1A:
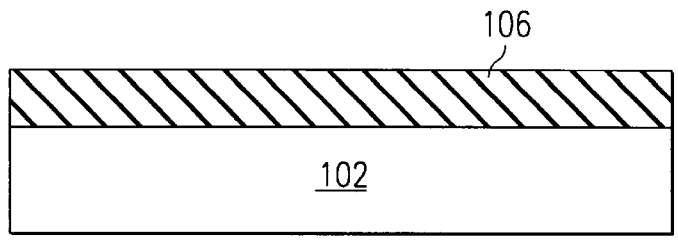
FIGS. 1A–1E show an example of a typical prior art fabrication process for microcomponents.
Figure 1B:
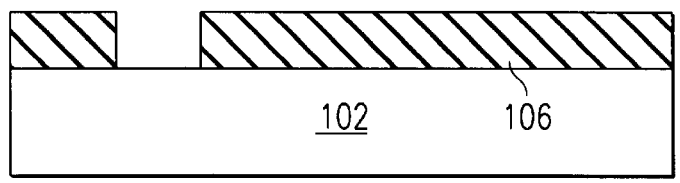
Figure 1C:
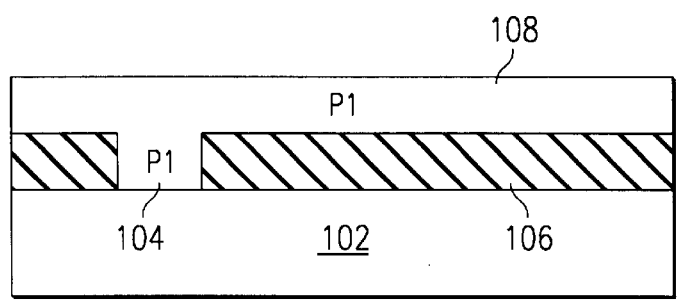
Figure 1D:
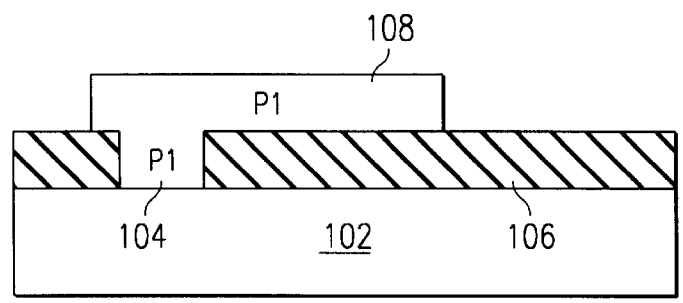
Figure 1E:
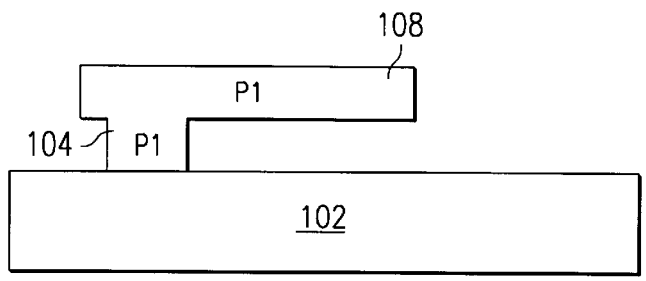
Figure 2:
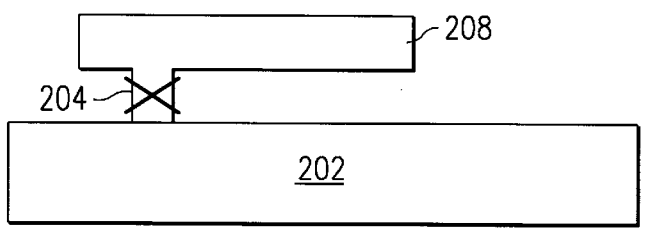
FIG. 2 shows an example of a prior art technique for removing an anchored microcomponent from its substrate.
Figure 3:
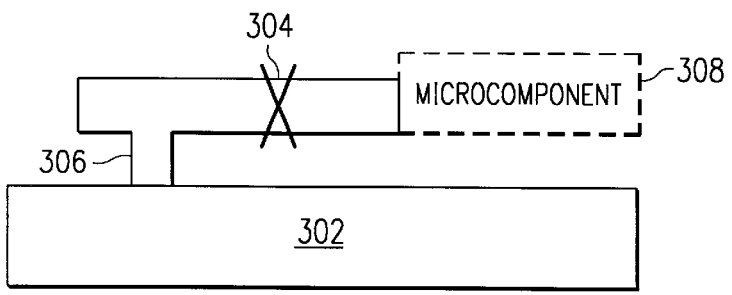
FIG. 3 shows a further example of a prior art technique for removing an anchored microcomponent from its substrate.
Figure 4A:
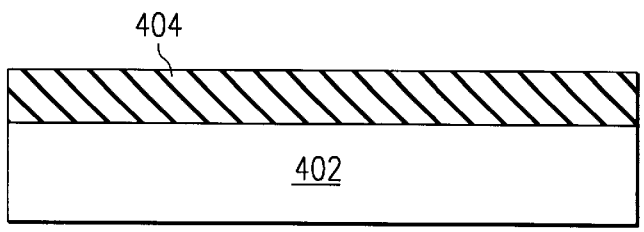
FIGS. 4A–4H show an example of a fabrication process that enables totally released microcomponents.
Figure 4B:
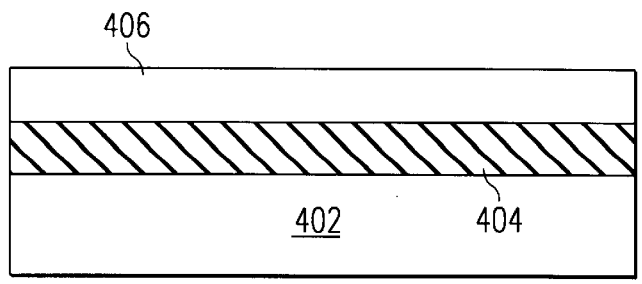
Figure 4C:
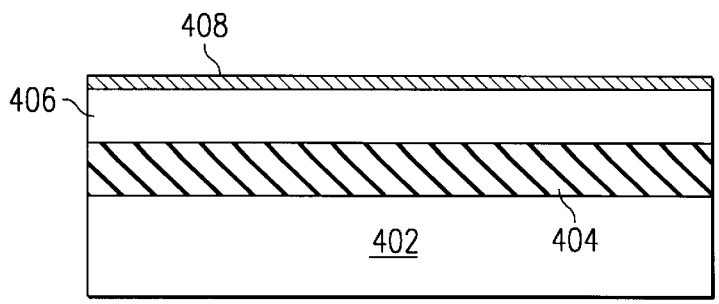
Figure 4D:
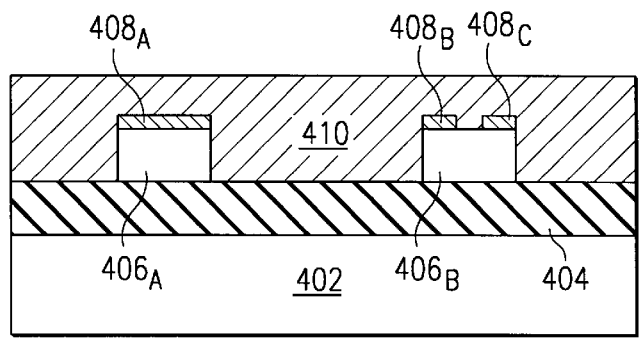

Fabrication processes that allow for "totally released" microcomponents (e.g., standalone microcomponents that are totally released from the substrate) are known. For example, the fabrication process disclosed in U.S. Pat. No. 4,740,410 issued to Muller et al. entitled "MICROMECHANICAL ELEMENTS AND METHODS FOR THEIR FABRICATION," U.S. Pat. No. 5,660,680 issued to Chris Keller entitled "METHOD FOR FABRICATION OF HIGH VERTICAL ASPECT RATIO THIN FILM STRUCTURES," and U.S. Pat. No. 5,645,684 issued to Chris Keller entitled "MULTILAYER HIGH VERTICAL ASPECT RATIO THIN FILM STRUCTURES". As a further example, concurrently filed and commonly assigned U.S. patent application Ser. No. 09/569,330 entitled "METHOD AND SYSTEM FOR SELF-REPLICATING MANUFACTURING STATIONS" allows for fabrication of totally released microcomponents. Furthermore, the fabrication process disclosed in "METHOD AND SYSTEM FOR SELF-REPLICATING MANUFACTURING STATIONS" also allows for the fabrication of electrically isolated microcomponents. An example of such a fabrication process that enables totally released microcomponents is described in conjunction with FIGS. 4A–4H. Turning to FIG. 4A, a substrate (e.g., a wafer) 402 is provided, on which a sacrificial release layer (e.g., silicon oxide) 404 is deposited. As shown in FIG. 4B, a base layer of polysilicon ("Poly Base") 406 is then deposited. Additionally, an insulating layer (e.g., silicon nitride) 408 may then be deposited to cap the Poly Base layer 406, as shown in FIG. 4C. The insulating layer 408 and Poly Base layer 406 are then patterned (e.g., using known lithography techniques), which may, for example, result in separate Poly Base layers $406_A$ and $406_B$, wherein Poly Base layer $406_A$ is capped with insulating layer $408_A$ and Poly Base layer $406_B$ is capped with insulating layers $408_B$ and $408_C$, as shown in FIG. 4D. Thus, in patterning the insulating layer, an aperture may be formed through the insulating layer to allow for access to the Poly Base layer, as shown with the Poly Base layer $406_B$ of FIG. 4D. As further shown in FIG. 4D, another layer of sacrificial release material (e.g., silicon oxide) 410 is then deposited.

Figure 4E:
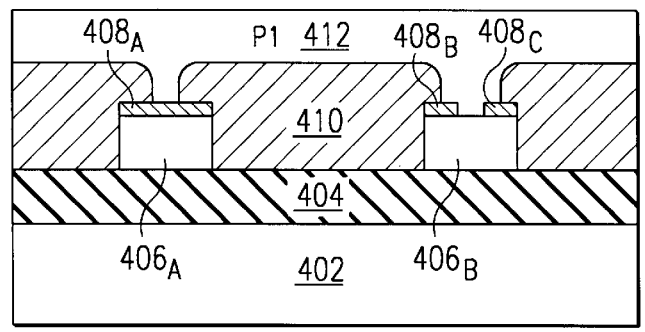
Figure 4F:
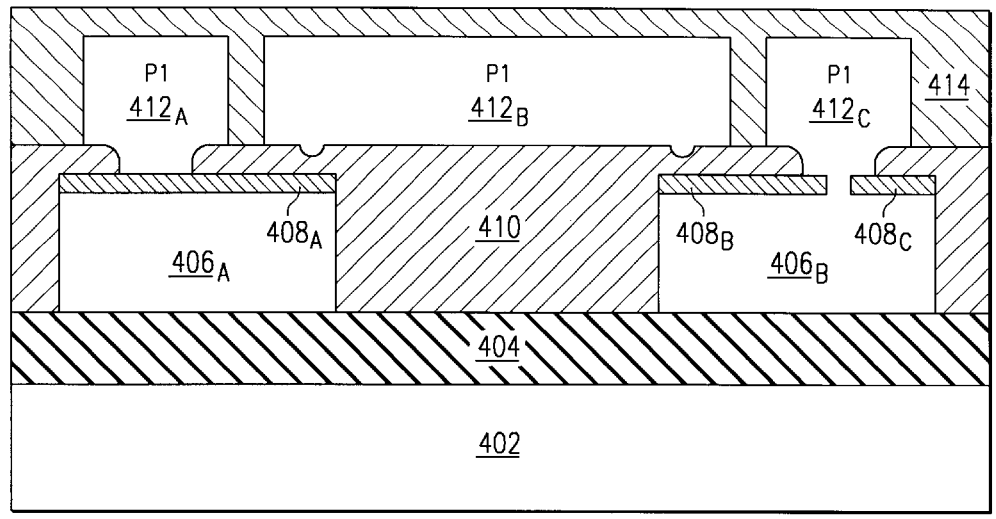
Figure 4G:
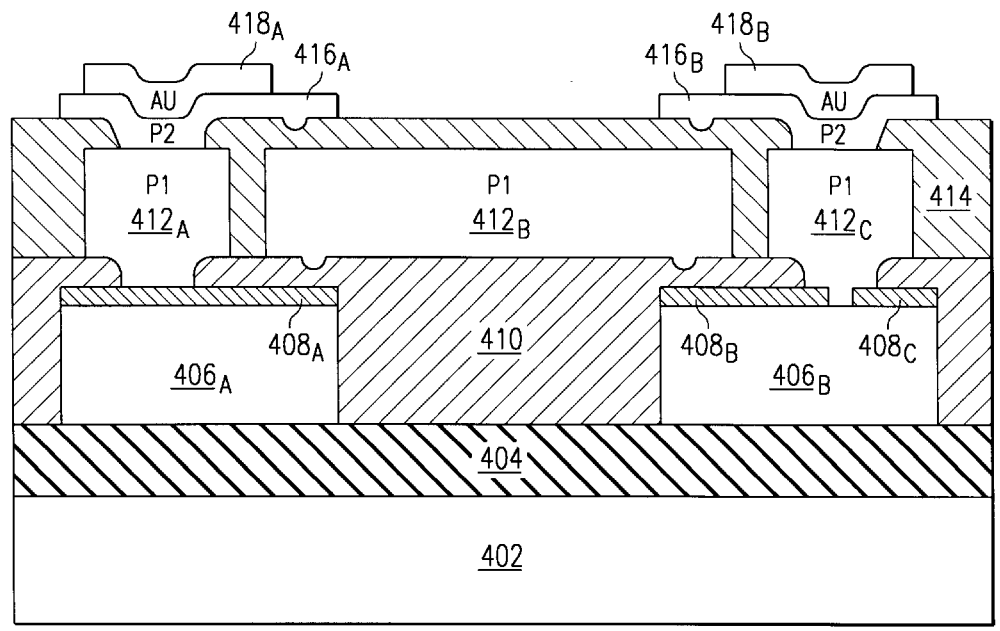
Figure 4H:
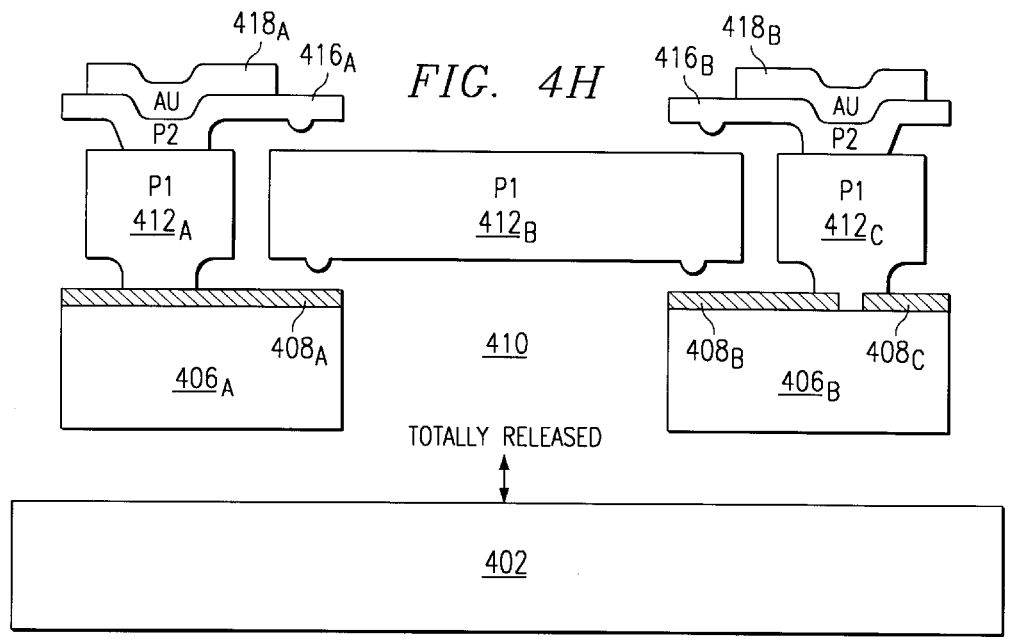

As shown in FIG. 4E, the sacrificial release layer 410 may then be patterned, and then a polysilicon layer (i.e., "P1") 412 may be deposited. The newly deposited P1 layer 412 may then be patterned, which may, for example, result in separate P1 components $412_A$, $412_B$, and $412_C$ shown in FIG. 4F. As further shown in FIG. 4F, another layer of sacrificial release material (e.g., silicon oxide) 414 is then deposited. As shown in FIG. 4G, sacrificial release layer 414 may then be patterned, and then another polysilicon layer (i.e., "P2") may be deposited and patterned into components $416_A$ and $416_B$, as an example. As further shown in FIG. 4G, a good conducting material (e.g., gold) may be deposited and patterned to form, for example, gold layers $418_A$ and $418_B$. Of course, any number of successive layers may be formed in a similar manner. Finally, the component may be released, by exposing the sacrificial release layers 404, 410, and 414 to a releasing agent, such as hydrofluoric acid (HF). Thus, the resulting microcomponent fabricated with such process may be totally released from the wafer 402, as shown in FIG. 4H. Furthermore, this fabrication process enables the microcomponent to have electrical isolation. It should be recognized that the present invention is not intended to be limited only to the above-described fabrication process, but rather such fabrication process is intended solely as an example that renders the disclosure enabling for many other fabrication processes for fabricating totally released microcomponents. Thus, any fabrication process now known or later developed is intended to be within the scope of the present invention.

Given that such fabrication processes enable microcomponents that are totally released from the substrate, situations may arise in which it is desirable to constrain such totally released microcomponents. That is, it may be desirable to restrict or restrain such totally released microcomponents to a base. For example, when a microcomponent is totally released from its substrate during exposure to a releasing agent, such microcomponent may become lost, mis-positioned, or otherwise difficult to handle. For instance, if the microcomponent were totally released from the substrate during a HF bath, the microcomponent might float around in the HF bath or otherwise present difficulties in handling such microcomponent. Thus, a preferred embodiment of the present invention provides a system, method, and apparatus for constraining (e.g., restricting or restraining) totally released microcomponents, whether it be to another microcomponent, the substrate itself, or any other type of desirable surface.

Figure 5:
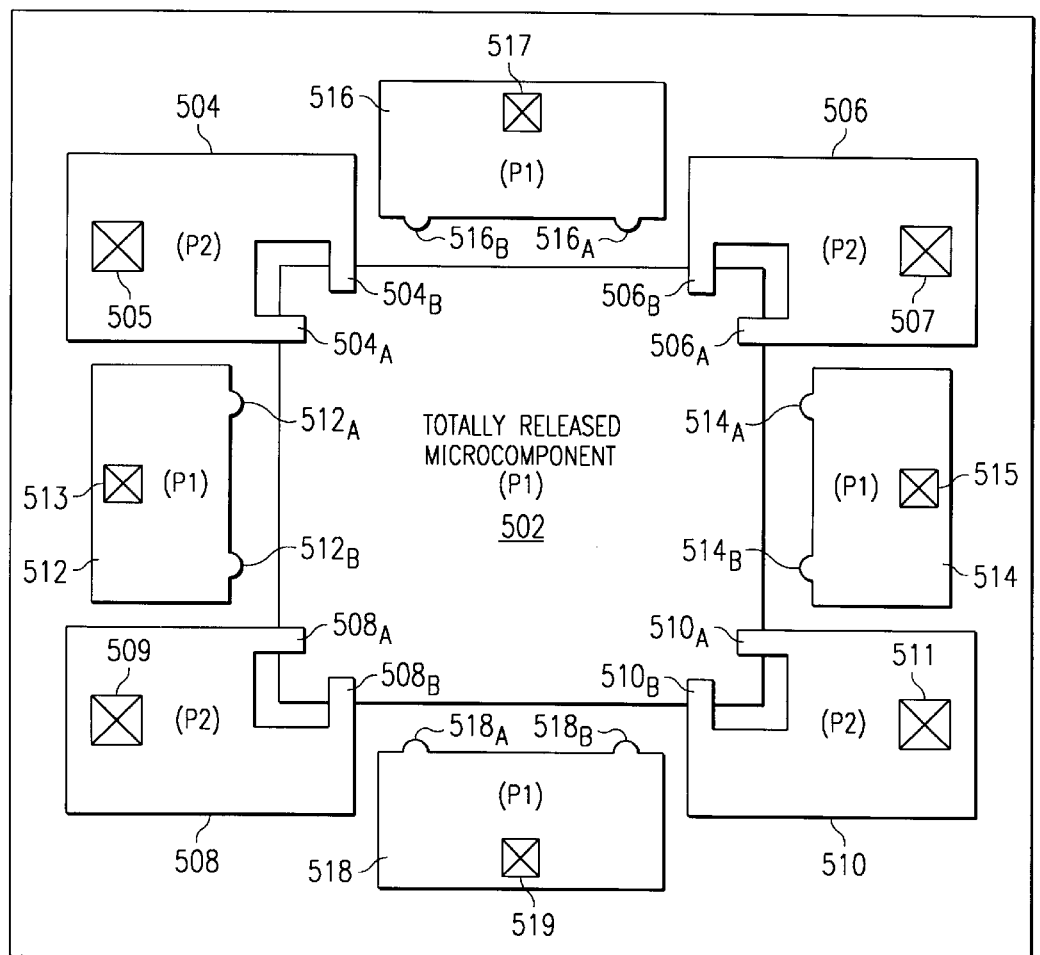
FIG. 5 shows an exemplary implementation of a preferred embodiment for constraining a totally released microcomponent to a substrate.

A preferred embodiment provides one or more constraining components (which may also be referred to as constraining members or constraints), which restrain or restrict a totally released microcomponent to a base. In a most preferred embodiment one or more constraining members are implemented to overhang portions of a totally released microcomponent to aid in retaining such microcomponent. Turning to FIG. 5, an exemplary implementation of a preferred embodiment of the present invention is shown. As shown, constraining members 504, 506, 508 and 510 are included to constrain totally released microcomponent 502 to a base, such as a substrate (e.g., wafer) 500. In the exemplary implementation of FIG. 5, constraining members 504, 506, 508, and 510 each include flaps (which may also be referred to herein as "tabs") that overhang portions of the totally released microcomponent 502. More specifically, in such exemplary implementation, constraining member 504 includes overhanging flaps $504_A$ and $504_B$, constraining member 506 includes overhanging flaps $506_A$ and $506_B$, constraining member 508 includes overhanging flaps $508_A$ and $508_B$ and constraining member 510 includes overhanging flaps $510_A$ and $510_B$. Thus, as described in greater detail below, the constraining members 504, 506, 508, and 510 of the exemplary implementation of FIG. 5 work to constrain the totally released microcomponent 502 with the base 500.

In the exemplary implementation of FIG. 5, the totally released microcomponent 502 may be fabricated as a P1 layer (i.e., first layer of polysilicon), and the constraining members 504, 506, 508, and 510 may be fabricated as a P2 layer (i.e., second layer of polysilicon), such that the constraining members' respective flaps overhang portions of the totally released microcomponent 502. Of course, it should be recognized that the totally released microcomponent may be implemented having any number of layers and the constraining members may be implemented in a manner so as to constrain such microcomponent to substrate 500. For example, constraining members may be implemented such that flaps, as those shown in the exemplary implementation of FIG. 5, overhang a portion of the totally released microcomponent in a manner to constrain such microcomponent to the substrate.

For instance, the constraining members may be implemented within a layer above the totally released microcomponent 502 (or at least above a layer of a portion of microcomponent 502) such that flaps of the constraining members overhang portions of the microcomponent 502. Suppose, for instance, that the center portion of microcomponent 502 is implemented having two layers of polysilicon (or other materials, such as conducting materials and/or insulating materials, as examples) but the corners of microcomponent 502 is implemented having only one layer (e.g., one layer of polysilicon). Thus, in this case, the top layer of the microcomponent 502 may be P2 (i.e., in the center of the microcomponent), and the corners of the microcomponent may be P1. The constraining members may be implemented as P2 layers, such that the flaps of such constraining members overhang the corners of the microcomponent 502. Accordingly, the constraining members 502 may not be implemented as a layer above the top layer of the microcomponent 502, but are preferably implemented as a layer above at least a portion of the microcomponent 502.

In the exemplary implementation of FIG. 5, at least the corners of microcomponent 502 are implemented as a P1 layer, and the constraining members 504, 506, 508, and 510 are implemented as a P2 layer. As further shown in FIG. 5, each constraining member is anchored to the substrate 500. More specifically, constraining member 504 is anchored to substrate 500 with anchor 505, constraining member 506 is anchored to substrate 500 with anchor 507, constraining member 508 is anchored to substrate 500 with anchor 509, and constraining member 510 is anchored to substrate 500 with anchor 511. As shown in FIG. 5, constraining members 504, 506, 508, and 510 work to restrict the totally released microcomponent 502 in the direction vertical (or normal) to the surface of the substrate 500. Thus, such constraining members may be referred to herein as "vertical constraining members."

Further constraining members may be included to restrict the totally released microcomponent 502 in directions horizontal (or lateral) to the surface of the substrate 500.

For example, the exemplary implementation of FIG. 5 includes constraining members (or "bumpers") 512, 514, 516, and 518, which work to restrict the microcomponent 502 in directions horizontal to the surface of substrate 500. Thus, such constraining members may be referred to herein as "horizontal constraining members" or "lateral constraining members." Such horizontal constraining members are preferably implemented on the same layer as microcomponent 502 to enable such horizontal constraining members to restrict lateral movement of microcomponent 502 respective to the surface of substrate 500. As shown in FIG. 5, horizontal constraining members 512, 514, 516, and 518 are implemented as PI layers. Thus, if microcomponent 502 moves laterally in any direction along the surface of substrate 500, such microcomponent 502 will eventually engage one or more of the horizontal constraining members 512, 514, 516, and 518.

As further shown in FIG. 5, horizontal constraining members 512, 514, 516, and 518 preferably include a dimple to reduce the amount of surface area in contact when engaging the microcomponent 502. More specifically, constraining members 512, 514, 516, and 518 include dimples $512_A$, $512_B$, $514_A$, $514_B$, $516_A$, $516_B$, $518_A$, and $518_B$, as shown. It is generally desirable to reduce the amount of surface area in contact between the constraining members and the totally released microcomponent in order to reduce the sticking effects that are present on such a small scale. Of course, in some implementations it may be desirable to have a relatively large amount of surface area in contact between the constraining members and the totally released microcomponent, such that the sticking effects may aid in constraining the microcomponent, and any such implementation is intended to be within the scope of the present invention.

As discussed above in conjunction with FIG. 5, a most preferred embodiment provides vertical constraining members (e.g., constraining members 504, 506, 508, and 510) that restrain or restrict the totally released microcomponent 502 to substrate 500. It should be understood that such vertical constraining members may not be implemented to hold the totally released microcomponent 502 rigidly against the surface of substrate 500, but rather such vertical constraining members may be implemented to allow for an acceptable amount of vertical movement (or "play") of microcomponent 502 relative to the surface of substrate 500, while still preventing the totally released microcomponent 502 from inadvertently escaping the substrate 500. As an example, in a most preferred embodiment, the vertical constraining members include flaps (or tabs) that overhang at least a portion of the totally released microcomponent 502, as shown in FIG. 5, with approximately one micron (Am) separation between the top of microcomponent 502 and such flaps when microcomponent 502 is resting on the surface of substrate 500. Of course any amount of separation between the vertical constraining members and the totally released microcomponent that provides an acceptable amount of constraint in the vertical direction may be implemented, and any such implementation is intended to be within the scope of the present invention. Furthermore, the vertical constraining members may be implemented to engage the totally released microcomponent 502 and maintain such microcomponent 502 relatively flush against the surface of substrate 500.

As further disclosed in conjunction with FIG. 5, a most preferred embodiment provides horizontal constraining members (e.g., constraining members 512, 514, 516, and 518) that restrain or restrict the totally released microcomponent 502 along the surface of substrate 500. It should be understood that such horizontal constraining members may not be implemented to hold the totally released microcomponent 502 rigidly in place, but rather such horizontal constraining members may be implemented to allow for an acceptable amount of lateral movement (or "play") of microcomponent 502 relative to the surface of substrate 500. As an example, in a most preferred embodiment, each horizontal constraining member is positioned with approximately one micron ($\mu$m) separation between a side of microcomponent 502 and such horizontal constraining member when microcomponent 502 is in its most desired position on substrate 500 (e.g., "centered" on substrate 500). Accordingly, such horizontal constraining members may work to constrain totally released microcomponent 502 to a most desired position with a 1 $\mu$m positional error. Of course any amount of separation between the horizontal constraining members and the totally released microcomponent that provides an acceptable amount of constraint in the horizontal direction may be implemented, and any such implementation is intended to be within the scope of the present invention. Furthermore, the horizontal constraining members may be implemented to engage the totally released microcomponent 502 and maintain such microcomponent 502 relatively rigidly positioned (i.e., resulting in very little or no amount of positional error).

It should be recognized that constraining members (both vertical and horizontal) may be included in a most preferred embodiment to aid in maintaining a desired position of a totally released microcomponent. For example, vertical and horizontal constraining members work to ensure that a totally released microcomponent has a desired position to within an acceptable degree of positional error. As described above, the constraining members of a most preferred embodiment work to restrict movement of the totally released microcomponent to approximately 1 $\mu$m vertical to the substrate and approximately 1 $\mu$m lateral to the substrate. Accordingly, such a most preferred embodiment ensures that the totally released microcomponent is positioned to within approximately 1 $\mu$m of a most lo desired position. Furthermore, the orientation of the totally released microcomponent relative to the substrate may be constrained by the constraining members. For example, the horizontal constraining members of a most preferred embodiment may be arranged to not only restrict translational movement of the totally released microcomponent lateral to the substrate, but such horizontal constraining members may also be arranged to restrict rotational movement of the totally released microcomponent lateral to the substrate. Such positional accuracy may be desirable, for example, to enable positional assembly operations to be performed in a manner that requires very little feedback. For instance, totally released microcomponents of a preferred embodiment may be utilized for self-replication assembly operations, as disclosed in co-pending and commonly assigned U.S. patent application Ser. No. 09/569,330 entitled "METHOD AND SYSTEM FOR SELF-REPLICATING MANUFACTURING STATIONS."

Accordingly, a preferred embodiment provides constraining members that are utilized to restrict or restrain the amount of movement of a totally released component relative to a base (e.g., substrate). Preferably, such constraining members work to prevent a totally released microcomponent from inadvertently escaping (or becoming completely disassociated from) a base. However, at some point, one will typically desire to remove the totally released microcomponent from a base, such as its associated substrate. Therefore, a desire exists for implementing the constraining members of a preferred embodiment in a manner that enables one to move, disengage, disable, or otherwise bypass the constraints presented by such constraining members in order to remove a totally released microcomponent from its base. A most preferred embodiment provides constraining members that work to prevent a totally released microcomponent from inadvertently escaping (or becoming completely disassociated from) its substrate, while also enabling one to overcome or bypass such constraints in order to remove such a microcomponent from its associated substrate when desired.

Various implementations may be utilized to enable constraining members that prevent a totally released microcomponent from inadvertently escaping (or becoming completely disassociated from) its base (e.g., substrate) while also allowing one to overcome or bypass such constraints in order to remove such a microcomponent from its associated base when desired. As one example, one or more of the constraining members may be coupled to an actuator which, when activated, moves such constraining members to permit the constrained microcomponent to be removed from its associated base. For instance, one or more of the vertical constraining members 504, 506, 508, and 510 may be coupled to an actuator, such that upon activation of the actuator the overhanging flaps or moved to no longer overhang a portion of microcomponent 502, thereby allowing one to remove microcomponent 502 from such constraints.

Figure 6:
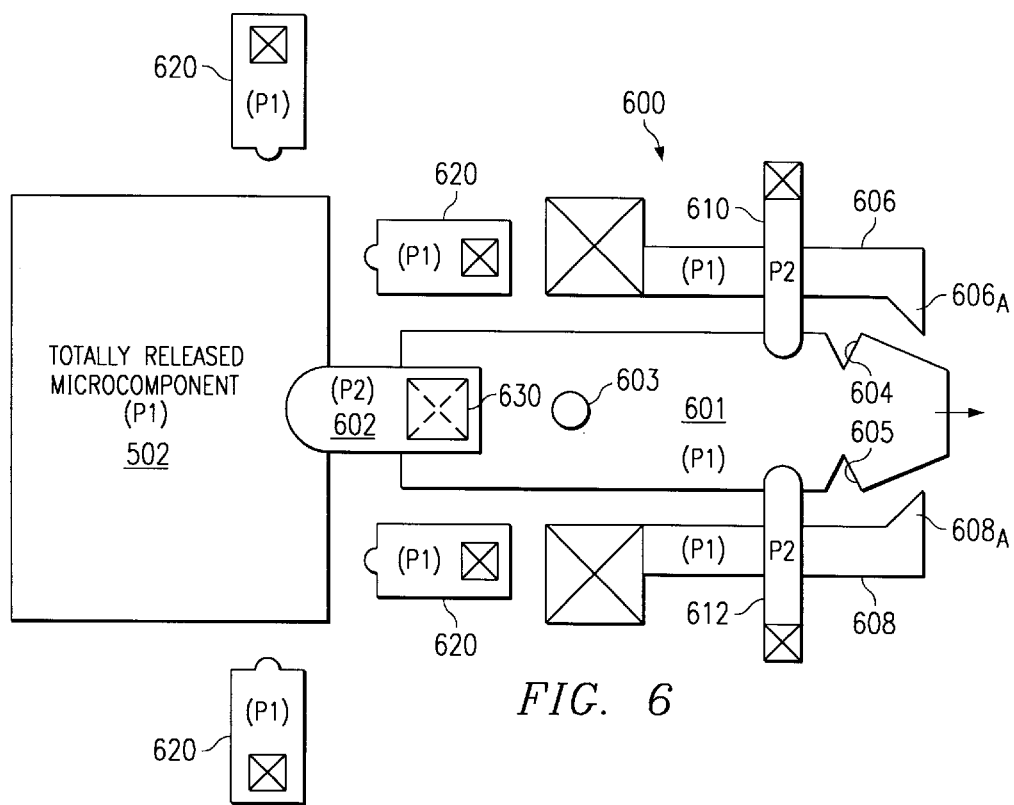
FIG. 6 shows an exemplary implementation of a movable constraining member that can be moved to a position to unconstrain a totally released microcomponent.

Turning now to FIG. 6, a further exemplary implementation of a constraining member 600 is shown. Exemplary horizontal constraining members 620 are provided in the implementation of FIG. 6 to restrict lateral movement of totally released microcomponent 502 relative to its associated base (e.g., substrate). Additionally, an exemplary vertical constraining member 600 is provided, which includes a flap (or tab) 602 that overhangs a portion of totally released microcomponent 502. For instance, at least a portion of totally released microcomponent 502 may be implemented as a P1 layer, and flap 602 may be implemented as a P2 layer to overhang at least a portion of the P1 layer of microcomponent 502. Also, flap 602 may be coupled (e.g., by via 630) to a P1 layer 601, which includes notches (or wedges) 604 and 605. As further shown, constraining member 600 may further include cantilevers 606 and 608 having barbed ends 606$_A$ and 608$_A$, respectively. Preferably, such cantilevers are implemented on the same layer as the notches 604 and 605 (e.g., P1), and each cantilever 606 and 608 is anchored to the substrate, as shown in FIG. 6. Constraining member 600 may further include flaps 610 and 612, which preferably overhang layer 601 to restrict vertical movement of flap 602 relative to the substrate. For example, flaps 610 and 612 may be implemented in the P2 layer to overhang the P1 layer 601 to which flap 602 is coupled. As shown in FIG. 6, such flaps 610 and 612 are preferably anchored to the substrate.

The exemplary implementation of FIG. 6 enables flap 602 of constraining member 600 to be moved lateral to the base (e.g., substrate), such that flap 602 does not overhang microcomponent 502. More specifically, flap 602 may be moved lateral to the base such that flap 602 does not overhang microcomponent 502, at which point barbed ends 606$_A$ and 608$_A$ engage notches 604 and 605 to latch flap 502 in a position not overhanging microcomponent 502. In the exemplary implementation of FIG. 6, a "handle" 603, which may be an aperture or other suitable type of receptacle, is included within the P1 layer 601, for instance. A probe (or other type of mechanism) may be utilized to engage such handle 603, and then a force may be applied by such a probe in the direction away from microcomponent 502 in order to move flap 602 such that it does not overhang microcomponent 502. Any type of handle and probe suitable for moving flap 602 in this manner are intended to be within the scope of the present invention. For example, handles and grippers (or probes) disclosed in co-pending and commonly assigned U.S. patent application Ser. No. 09/569,329 entitled "GRIPPER AND COMPLEMENTARY HANDLE FOR USE WITH MICROCOMPONENTS" may be utilized. It should be recognized that the constraining mechanism 600 may be implemented with any suitable type of coupling or latching mechanism for latching flap 602 in a position not overhanging microcomponent 502, and therefore is not intended to be limited solely to the cantilever and notch implementation of FIG. 6. As an example, any suitable type of coupling mechanism disclosed in co-pending and commonly assigned U.S. patent application Ser. No. 09/570,170 entitled "SYSTEM AND METHOD FOR COUPLING MICROCOMPONENTS" may be utilized for such latching.

In view of the above, a preferred embodiment provides constraining members that prevent a totally released microcomponent from inadvertently escaping (or becoming completely disassociated from) its base (e.g., substrate) while also allowing such constraints to be removed (e.g., moved to no longer constrain the microcomponent) in order to remove such a microcomponent from its associated base when desired. Rather than removing the constraints on a totally released microcomponent, such as is enabled by the exemplary implementation of FIG. 6, it may be desirable in some situations to retain the constraints on a totally released mechanism until one has grasped the microcomponent and moved the microcomponent away from the base. For instance, once the vertical constraints, such as vertical constraint 600 of FIG. 6 (which includes overhanging flap 602), are moved to no longer constrain microcomponent 502, nothing prevents the microcomponent from moving vertically relative to the base (e.g., substrate). Thus, if one does not have a grasp on such microcomponent, the microcomponent may "jump" off of the base, for example. For instance, an electrostatic charge may cause the totally released microcomponent that is no longer constrained vertically to "jump" off of the substrate. Of course, one may obtain a grasp of the totally released microcomponent 502 before removing the vertical constraint provided by constraining member 600. Additionally, further exemplary implementations are provided below, which may be utilized to constrain a totally released microcomponent until such microcomponent has been grasped and moved away from the base to which it is constrained.

Figure 7:
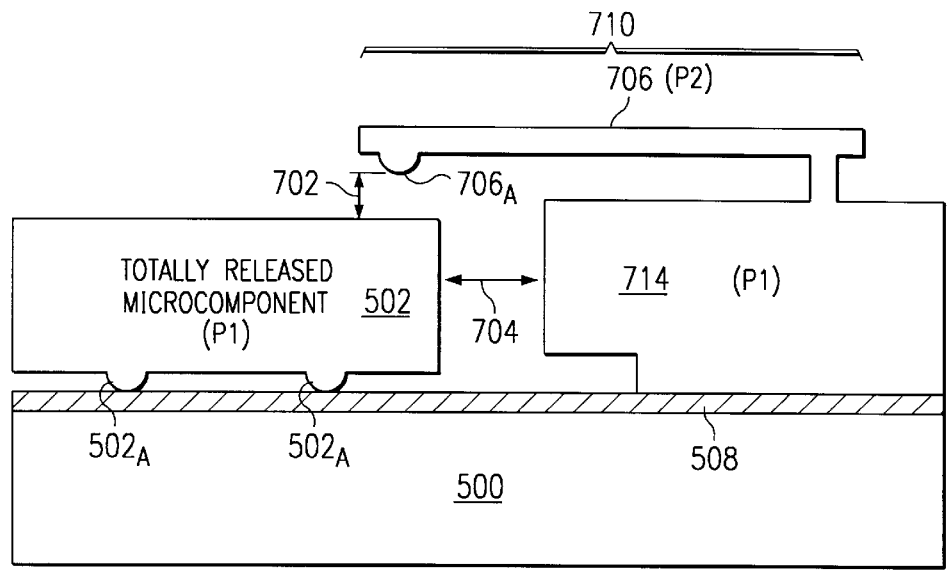
FIG. 7 shows an exemplary implementation of a vertical constraining member that may be utilized to constrain a totally released microcomponent until such microcomponent has been grasped and moved away from its substrate.

Turning to FIG. 7, an exemplary implementation of a vertical constraining member that may be utilized to constrain totally released microcomponent 502 until such microcomponent 502 has been grasped and moved away from base (e.g., substrate) 500 is shown. As shown in FIG. 7, a vertical constraining member may be implemented having a flap 706, a portion of which overhangs at least a portion of microcomponent 502. As with the various other exemplary constraining members disclosed herein, flap 706 may include a dimple 706$_A$ to reduce the amount of surface area in contact should microcomponent 502 engage flap 706. Also shown in FIG. 7, totally released microcomponent 502 may likewise include dimples 502$_A$ to reduce the amount of surface area in contact between microcomponent 502 and base 500. That is, as shown in FIG. 7, totally released microcomponent 502 may rest on the surface of base 500, which may be capped with an insulating layer 508, and dimples 502$_A$ may be included to reduce the amount of surface area in contact between microcomponent 502 and base 500 (or insulating layer 508). Such reduction in surface area contact may be desirable in order to reduce the sticking effects present on such a small-scale level. FIG. 7 further shows that, as with the various other exemplary constraining members disclosed herein, flap 706 may be separated a distance 702 from the top of microcomponent 502 when microcomponent 502 is resting on base 500. As discussed above, such separation distance 702 is most preferably approximately 1 $\mu$m, but may be any suitable distance (e.g., more or less than 1 $\mu$m).

An exemplary horizontal constraining member 714, is also provided in FIG. 7. FIG. 7 also shows that, as with the various other exemplary constraining members disclosed herein, horizontal constraining member 714 may be separated a distance 704 from the side of microcomponent 502 when microcomponent is located in its most desired position (e.g., centered on base 500). As discussed above, such separation distance 704 is most preferably approximately 1 $\mu$m, but may be any suitable distance. In the exemplary implementation of FIG. 7, flap 706 is preferably constructed from polysilicon (e.g., layer P2), and is constructed having a relatively long length 710. The length 710 of flap 706 results in flap 706 being relatively flexible in the direction vertical to base 500. However, such flap 706 is preferably rigid enough to prevent microcomponent 502 from inadvertently escaping base 500. For example, length 710 may be approximately 50 $\mu$m in length. Of course, in various implementations flap 706 may have any suitable length 710, and any such length is intended to be within the scope of the present invention. Thus, in the preferred operation of the exemplary implementation of FIG. 7, one would grasp microcomponent 502 and apply sufficient vertical force away from base 500 to cause flap 706 to flex (or bend), thereby enabling microcomponent 502 to be removed from its associated base 500 as desired.

Figure 8:
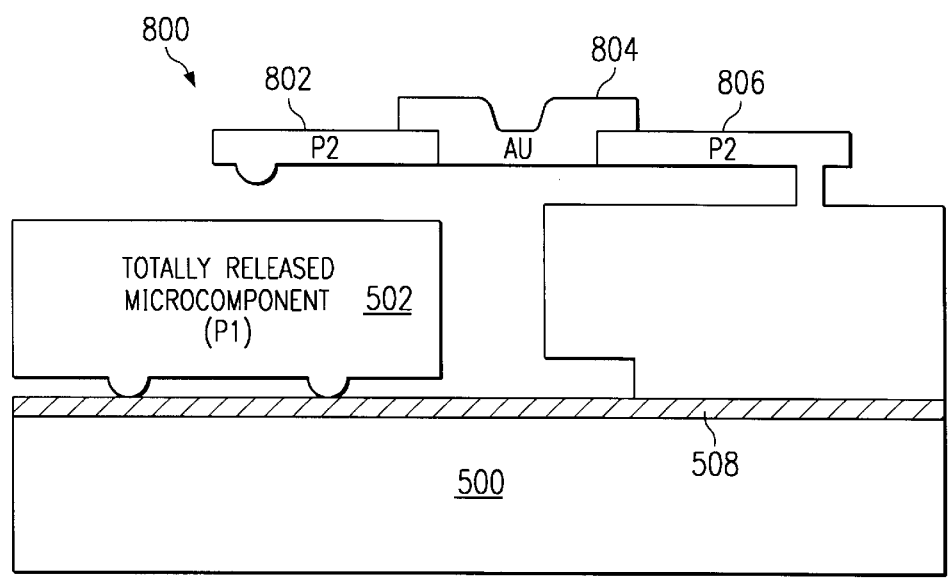
FIG. 8 shows a further exemplary implementation of a vertical constraining member that may be utilized to constrain a totally released microcomponent until such microcomponent has been grasped and moved away from its substrate.

Turning now to FIG. 8, another exemplary implementation of a vertical constraining member that may be utilized to constrain a totally released microcomponent 502 until such microcomponent 502 has been grasped and moved away from its associated base 500 is shown. As shown in FIG. 8, a vertical constraining member may be implemented having a flap 800, a portion of which overhangs at least a portion of totally released microcomponent 502. As with the exemplary implementation of FIG. 7, totally released microcomponent 502 may rest on the surface of base 500, which may be capped with an insulating layer 508, and microcomponent 502 may include dimples to reduce the amount of surface area in contact between microcomponent 502 and base 500 (or insulating layer 508). In the exemplary implementation of FIG. 8, flap 800 is implemented in a "hinged" manner. More specifically, flap 800 is implemented having three sections, shown as 802, 804 and 806 in FIG. 8. Sections 802 and 806 are preferably constructed from polysilicon (e.g., layer P2), and the middle section 804 is preferably constructed from a more flexible (or malleable) material, such as gold. As a result, the more flexible midsection 804 forms a type of "hinge" which enables the flap 800 to be relatively flexible in the direction vertical to base 500. However, such flap 800 is preferably rigid enough to prevent microcomponent 502 from inadvertently escaping base 500. Thus, in the preferred operation of the exemplary implementation of FIG. 8, one would grasp microcomponent 502 and apply sufficient vertical force away from base 500 to cause flap 800 to flex (or bend), thereby enabling microcomponent 502 to be removed from its associated base 500 as desired.

Figure 9:
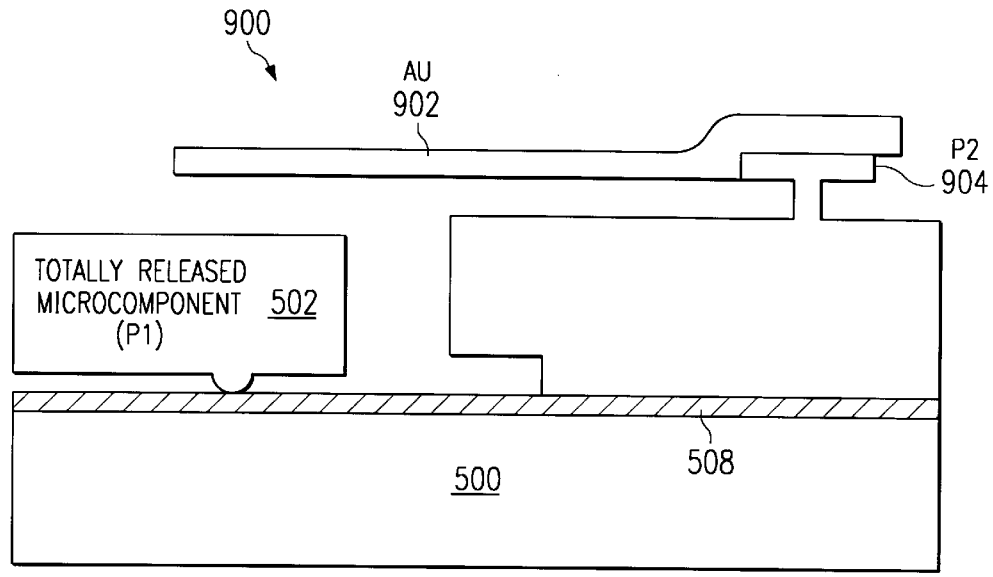
FIG. 9 shows still a further exemplary implementation of a vertical constraining member that may be utilized to constrain a totally released microcomponent until such microcomponent has been grasped and moved away from its substrate.

Turning now to FIG. 9, still a further exemplary implementation of a vertical constraining member that may be utilized to constrain a totally released microcomponent 502 until such microcomponent 502 has been grasped and moved away from its associated base 500 is shown. As with the exemplary implementation of FIGS. 7 and 8, totally released microcomponent 502 may rest on the surface of base 500, which may be capped with an insulating layer 508, and microcomponent 502 may include dimples to reduce the amount of surface area in contact between microcomponent 502 and base 500 (or insulating layer 508). As shown in FIG. 9, a vertical constraining member may be implemented having a flap 900, a portion of which overhangs at least a portion of totally released microcomponent 502. In the exemplary implementation of FIG. 9, flap 900 is implemented as a relatively malleable material, such as gold. More specifically, a gold layer may be deposited on P2, shown as 904 in FIG. 9, to form gold flap 900 to enable flap 900 to be relatively flexible in the direction vertical to substrate 500. However, such flap 900 is preferably rigid enough to prevent microcomponent 502 from inadvertently escaping base 500. Thus, in the preferred operation of the exemplary implementation of FIG. 9, one would grasp microcomponent 502 and apply sufficient vertical force away from base 500 to cause flap 900 to flex (or bend), thereby enabling microcomponent 502 to be removed from its associated base 500 as desired.

In view of the above, a preferred embodiment provides constraining members that enable a totally released microcomponent to be constrained to its associated base (e.g., substrate) until it is desired to remove such totally released microcomponent from such constraints. Such a preferred embodiment may be utilized, for example, during a fabrication process that results in a totally released microcomponent. For instance, constraining members may be implemented to hold a microcomponent in place on its associated substrate as the microcomponent is being exposed to a releasing agent (e.g., during an HF bath that totally released such microcomponent). Therefore, a preferred embodiment may aid in fabricating a totally released microcomponent in a manner that requires no physical breaking of components, such as anchors or tethers. As a result, the dust particles generated by such a physical breaking of components are eliminated. Further, the resulting totally released microcomponent can be much more accurately defined. For instance, unwanted portions of components (e.g., broken portions of an anchor or tether) can be eliminated from the totally released microcomponent. Thus, a totally released microcomponent may be fabricated having an accurate, predefined shape.

Figure 10:
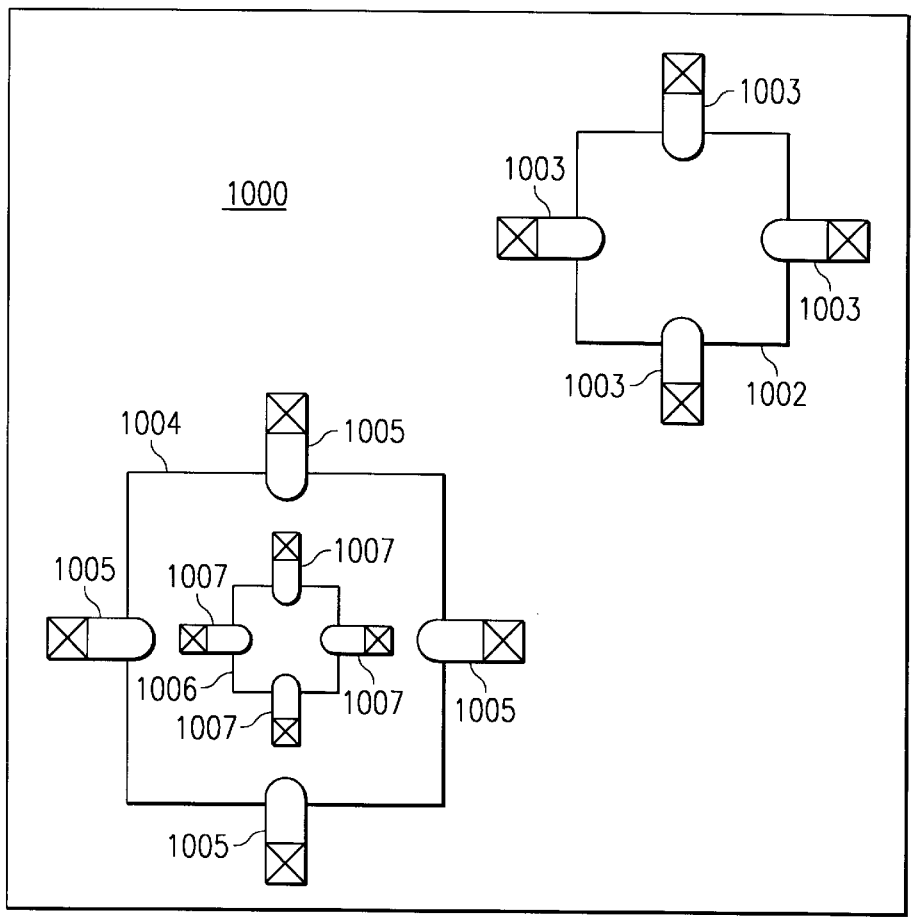
FIG. 10 shows an exemplary implementation of a pallet for post-fabrication handling of totally released microcomponents.

Furthermore, a preferred embodiment may aid in the post-fabrication handling of a totally released microcomponent. For example, in a preferred embodiment, a totally released microcomponent may be fabricated and constraining members may be utilized to restrict such totally released microcomponent with its associated substrate for handling after such fabrication, including for example shipment of the totally released microcomponent to a customer. To further aid in post-fabrication handling of totally released microcomponents, a preferred embodiment of the present invention may be implemented as a "pallet" having one or more microcomponents constrained thereto. Turning to FIG. 10 an exemplary pallet 1000 is shown. Pallet 1000 includes multiple totally released microcomponents constrained thereto, such as microcomponents 1002 and 1004. As shown, totally released microcomponents 1002 and 1004 may be constrained to pallet 1000 with constraining members 1003 and 1005, respectively. As further shown in FIG. 10, totally released microcomponents may be nested within pallet 1000. For example, totally released microcomponent 1006 may be constrained to microcomponent 1004 with constraining members 1007, and microcomponent 1004 is in turn constrained to pallet 1000. Of course, microcomponent 1004, for example, may in fact be a substrate to which one or more other substrates or microcomponents, such as microcomponent 1006, are constrained. Pallet 1000 may include any number of such bases (e.g., substrates and/or microcomponents), and such bases may be arranged in a desirable manner on pallet 1000. For example, microcomponents 1002 and 1004 may be arranged on pallet 1000 in a suitable manner for positional assembly operations to be performed. For instance, self-replication assembly operations such as those disclosed in co-pending and commonly assigned U.S. patent application Ser. No. 09/569,330 entitled "METHOD AND SYSTEM FOR SELF-REPLICATING MANUFACTURING STATIONS."

In a most preferred embodiment, pallet 1000 is approximately one centimeter by one centimeter in size. However, pallet 1000 may be implemented having any desirable size, and any such implementation is intended to be within the scope of the present invention. Such a pallet 1000 may aid in the handling of one or more microcomponents constrained thereto. For example, a "handle," such as disclosed in co-pending and commonly assigned U.S. patent application Ser. No. 09/569,329 entitled "GRIPPER AND COMPLEMENTARY HANDLE FOR USE WITH MICROCOMPONENTS," may be implemented on pallet 1000, wherein such handle may enable one to use a gripper device (e.g., tweezers) to grasp such handle in order to perform pick-and-place operations with pallet 1000. For instance, totally released microcomponents, such as microcomponents 1002 and 1004 may be implemented without a handle, and a handle may instead be included on pallet 1000 to aid in the handling of such microcomponents by enabling a gripper device to obtain a grasp of the handle of such pallet 1000 in order to pick-and-place pallet 1000 as desired. Thus, an entire microcomponent, such as microcomponent 1002 or 1004, may be smaller in size than a "handle" because such components may be implemented without such a handle, and a handle may be included on pallet 1000 to provide aid in grasping and handling such pallet 1000.

Furthermore, the constraining members of pallet 1000 may be implemented to be reusable. For example, such constraining members may be implemented as an in-plane squeeze connector disclosed in co-pending and commonly assigned U.S. patent application Ser. No. 09/570,170 entitled "SYSTEM AND METHOD FOR COUPLING MICROCOMPONENTS," wherein such constraining members may be moved to a position to release a microcomponent from constraint and then later moved back to a constraining position. Thus, pallet 1000 is most preferably capable of being reused for handling totally released microcomponents constrained thereto. For instance, pallet 1000 may have a first set of totally released microcomponents constrained thereto. Such microcomponents may be unconstrained (e.g., by removing the constraints provided by the pallet's constraining members), and such first set of microcomponents may be removed from pallet 1000 (e.g., as assembly operations are performed with such first set of microcomponents). Thereafter, a second set of totally released microcomponents may be constrained to pallet 1000. That is, a second set of totally released microcomponents may be placed in the voids left by the removed first set of microcomponents, and constraining members may be positioned to constrain such second set of microcomponents to pallet 1000. Such reuse of a pallet may be desirable to provide a consistent positional arrangement of microcomponents constrained thereto at a reduced cost, for instance.

In view of the above, a pallet, such as pallet 1000, aids in the post-fabrication handling of totally released microcomponents in a manner that reduces the potential for such microcomponents becoming lost, mis-positioned, damaged, and/or otherwise mis-handled. A pallet may be utilized, for example, to deliver totally released microcomponents to a customer, wherein such microcomponents are prearranged/pre-positioned on the pallet in a desirable manner, e.g., in a manner that allows for such microcomponents to be utilized in performing positional assembly operations. Furthermore, such a pallet may be implemented having reusable constraints to enable positional consistency at a reduced cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of handling microcomponents, said method comprising:

releasing at least one microcomponent from a substrate of fabrication; and providing at least one constraining member in a predefined area to removably constrain said at least one released microcomponent to a said predefined area.

2. The method of claim 1 wherein said releasing of said at least one microcomponent from a said substrate of fabrication does not include breaking a physical coupling between said at least one microcomponent and said substrate of fabrication.

3. The method of claim 1 wherein said predefined area is a base.

4. The method of claim 3 wherein said base is a substrate.

5. The method of claim 3 wherein said base is a pallet.

6. A method of handling microcomponents, said method comprising:

releasing at least one microcomponent from a substrate of fabrication; and providing at least one constraining member to constrain said at least one released microcomponent to a base, wherein said base is another microcomponent.

7. A method of handling microcomponents, said method comprising:

releasing at least one microcomponent from a substrate of fabrication; and constraining said at least one released microcomponent to a base, wherein said constraining includes overhanging at least a portion of a vertical constraining member over said at least one released microcomponent to restrict vertical movement of said at least one released microcomponent relative to said base.

8. The method of claim 7 wherein said at least a portion of a vertical constraining member includes at least one flap overhanging said at least one released microcomponent.

9. A method of handling microcomponents, said method comprising:

releasing at least one microcomponent from a substrate of fabrication; and constraining said at least one released microcomponent to a base, wherein said constraining includes arranging at least one horizontal constraining member to restrict lateral movement of said at least one released microcomponent relative to said base.

10. The method of claim 9 wherein said at least one horizontal constraining member restricts lateral translational movement of said at least one released microcomponent relative to said base.

11. The method of claim 9 wherein said at least one horizontal constraining member restricts lateral rotational movement of said at least one released microcomponent relative to said base.

12. A method of handling microcomponents, said method comprising:

releasing at least one microcomponent from a substrate of fabrication; and constraining said at least one released microcomponent to a base, wherein said constraining permits an acceptable degree of movement of said at least one released microcomponent relative to said base.

13. The method of claim 12 wherein said constraining permits said at least one released microcomponent to move approximately 1 $\mu$m vertically relative to said base.

14. The method of claim 12 wherein said constraining permits said at least one released microcomponent to move approximately 1 $\mu$m laterally relative to said base.

15. A method of handling microcomponents, said method comprising:

fabricating at least one microcomponent on a substrate of fabrication;

releasing said at least one microcomponent from said substrate of fabrication; and providing at least one constraining member in a predefined area to constrain said at least one released microcomponent to said predefined area, wherein said constraining includes constraining said at least one microcomponent to said predefined area during said fabricating.

16. The method of claim 15 wherein said constraining further includes:

constraining said at least one microcomponent during exposure of said at least one microcomponent to a releasing agent to release said microcomponent from said substrate of fabrication.

17. A method of handling microcomponents, said method comprising:

releasing at feast one microcomponent that is released from a substrate of fabrication; and constraining said at least one released microcomponent to a predefined area with at least one constraining member provided in said predefined area; and unconstraining said at least one released microcomponent.

18. The method of claim 17 wherein said unconstraining includes:

moving said at least one constraining member to remove said at least one released microcomponent from constraint of said at least one constraining member.

19. The method of claim 17 wherein said unconstraining includes:

applying sufficient force against said at least one constraining member to cause said at least one constraining member to flex to allow removal of said at least one released microcomponent from constraint of said at least one constraining member.

20. An apparatus for handling microcomponents, said apparatus comprising:

a base from which at least one microcomponent is released; and at least one constraining member to constrain said at least one released microcomponent to said base, wherein said at least one constraining member is arranged to allow for unconstraining said at least one released microcomponent when desired.

21. The apparatus of claim 20 wherein said at least one constraining member is arranged to constrain said at least one microcomponent during release of said at least one microcomponent from a substrate.

22. The apparatus of claim 21 wherein said at least one constraining member is arranged to constrain said at least one microcomponent during exposure of said at least one microcomponent to a releasing agent to release said microcomponent from said substrate.

23. The apparatus of claim 20 wherein said at least one constraining member is moveable.

24. The apparatus of claim 23 wherein said at least one constraining member can be moved to unconstrain said at least one released microcomponent from said base.

25. The apparatus of claim 20 wherein said at least one constraining member is flexible.

26. The apparatus of claim 25 wherein said at least one constraining member can be flexed to unconstrain said at least one released microcomponent from said base.

27. The apparatus of claim 20 wherein said at least one constraining member is arranged to constrain said at least one released microcomponent to a predefined area.

28. The apparatus of claim 20 wherein said base is a substrate.

29. The apparatus of claim 20 wherein said base is another microcomponent.

30. The apparatus of claim 20 wherein said base is a pallet.

31. The apparatus of claim 20 wherein said at least one constraining member is arranged to permit an acceptable degree of movement of said at least one released microcomponent relative to said base.

32. The apparatus of claim 31 wherein said at least one constraining member is arranged to permit said at least one released microcomponent to move approximately 1 $\mu$m vertically relative to said base.

33. The apparatus of claim 31 wherein said at least one constraining member is arranged to permit said at least one released microcomponent to move approximately 1 $\mu$m laterally relative to said base.

34. An apparatus for handling microcomponents, said apparatus comprising:

a base from which at least one microcomponent is released; and at least one constraining member to constrain said at least one released microcomponent to said base, wherein said at least one constraining member includes at least one vertical constraining member arranged such that at least a portion of said vertical constraining member overhangs at least a portion of said at least one microcomponent to restrict vertical movement of said at least one microcomponent relative to said base.

35. The apparatus of claim 34 wherein said at least a portion of said vertical constraining member includes at least one flap overhanging at least a portion of said at least one microcomponent.

36. The apparatus of claim 34 wherein said at least one constraining member is arranged to allow for unconstraining said at least one released microcomponent when desired.

37. An apparatus for handling microcomponents, said apparatus comprising:

a base from which at least one microcomponent is released; and at least one constraining member to constrain said at least one released microcomponent to said base, wherein said at least one constraining member includes at least one horizontal constraining member arranged to restrict lateral movement of said at least one microcomponent relative to said base.

38. The apparatus of claim 37 wherein said at least one horizontal constraining member restricts lateral translational movement of said at least one microcomponent relative to said base.

39. The apparatus of claim 37 wherein said at least one horizontal constraining member restricts lateral rotational movement of said at least one microcomponent relative to said base.

40. A system comprising:

at least one microcomponent that is released from a substrate; and means for constraining movement of said at least one microcomponent relative to a base, wherein said constraining means is moveable relative to said base.

41. The system of claim 40 wherein said means for constraining comprises at least one vertical constraining means arranged to restrict vertical movement of said at least one microcomponent relative to said base.

42. The system of claim 40 wherein said means for constraining comprises at least one horizontal constraining means arranged to restrict lateral movement of said at least one microcomponent relative to said base.

43. The system of claim 42 wherein said at least one horizontal constraining means restricts lateral translational movement of said at least one microcomponent relative to said base.

44. The system of claim 42 wherein said at least one horizontal constraining means restricts lateral rotational movement of said at least one microcomponent relative to said base.

45. The system of claim 40 wherein said constraining means is arranged to constrain movement of said at least one microcomponent during release of said at least one microcomponent from said substrate.

46. The system of claim 45 wherein said constraining means is arranged to constrain movement of said at least one microcomponent during exposure of said at least one microcomponent to a releasing agent to totally release said microcomponent from said substrate.

47. The system of claim 40 wherein said means for constraining is arranged to constrain movement of said at least one released microcomponent to a predefined area of said base.

48. The system of claim 40 wherein said base is a substrate.

49. The system of claim 40 wherein said base is another microcomponent.

50. The system of claim 40 wherein said base is a pallet.

51. The system of claim 40 wherein said means for constraining is arranged to permit an acceptable degree of movement of said at least one released microcomponent relative to said base.

52. The system of claim 51 wherein said means for constraining is arranged to permit said at least one released microcomponent to move approximately 1 $\mu$m vertically relative to said base.

53. The system of claim 51 wherein said means for constraining is arranged to permit said at least one released microcomponent to move approximately 1 $\mu$m laterally relative to said base.

54. The system of claim 40 further comprising: at least one horizontal constraining means arranged to restrict lateral movement of said at least one microcomponent relative to said base.

55. The system of claim 54 wherein said at least one horizontal constraining means is moveable.

56. A system comprising:
at least one microcomponent that is released from a substrate; and means for constraining, said at least one microcomponent to a base, wherein said constraining means is moveable for unconstraining said at least one microcomponent from said base.

57. A method of handling microcomponents, said method comprising:
releasing at least one microcomponent from all substrates; and
providing at least one constraining member in a predefined area for constraining movement of said at least one released microcomponent relative to said predefined area.

58. A method of handling microcomponents, said method comprising:
releasing at least one microcomponent from a substrate of fabrication; and
constraining movement of said at least one released microcomponent relative to said substrate of fabrication.

59. The method of claim 58 wherein said constraining comprises;
constraining movement of said at least one released microcomponent relative to a predefined area of said substrate of fabrication.

60. The method of claim 58 wherein said constraining comprises:
removably constraining said at least one released microcomponent to said substrate of fabrication.

61. The method of claim 58 wherein said constraining comprises:
overhanging at least a portion of a vertical constraining member over at least a portion of said at least one released microcomponent to restrict vertical movement of said at least one released microcomponent relative to said substrate of fabrication.

62. A method of handling microcomponents, said method comprising:
releasing at least one microcomponent from a substrate of fabrication; and
constraining said at least one released microcomponent to a base without bonding said at least one released microcomponent to said base.

63. An apparatus for handling microcomponents, said apparatus comprising:
a base from which at least one microcomponent is released; and at least one constraining member to constrain said at least one released microcomponent to said base, wherein said at least one constraining member is moveable relative to said base.

64. The apparatus of claim 63 wherein said constraining member is moveable to a position for unconstraining said at least one released microcomponent when desired.

65. The apparatus of claim 63 wherein said base comprises a substrate on which said at least one released microcomponent is fabricated.

66. A system comprising:
at least one microcomponent that is released from a substrate of fabrication; and
means for constraining said at least one released microcomponent to said substrate of fabrication.

67. The system of claim 66 wherein said constraining means is moveable for unconstraining said at least one microcomponent from said substrate of fabrication.

* * * * *

UNITED STATES PATENT AND TRADEMARK OFFICE
CERTIFICATE OF CORRECTION

PATENT NO. : 6,677,225 B1　　　　　　　　　　　　　　　　　　　　　　　Page 1 of 1
DATED : January 13, 2004
INVENTOR(S) : Ellis et al.

It is certified that error appears in the above-identified patent and that said Letters Patent is hereby corrected as shown below:

Column 8,
Line 2, change "comers" to -- corners --.

Column 9,
Line 14, change "(Am)" to -- ($\mu$m) --.

Column 10,
Line 2, delete "1o".

Column 16,
Line 3, and 5, delete, "a".

Column 17,
Line 17, change "feast" to -- least --; delete "that is released".

Column 19,
Line 46, delete the comma after "constraining".

Signed and Sealed this

Twenty-fifth Day of May, 2004

JON W. DUDAS
*Acting Director of the United States Patent and Trademark Office*